(12) United States Patent
Yancey

(10) Patent No.: US 7,729,888 B2
(45) Date of Patent: Jun. 1, 2010

(54) SIGNAL-DRIVEN RECOVERY OF A DIGITAL PULSE STREAM

(75) Inventor: Jerry W. Yancey, Rockwall, TX (US)

(73) Assignee: L-3 Integrated Systems Company, Greenville, TX (US)

( * ) Notice: Subject to any disclaimer, the term of this patent is extended or adjusted under 35 U.S.C. 154(b) by 0 days.

(21) Appl. No.: 12/357,831

(22) Filed: Jan. 22, 2009

(65) Prior Publication Data

US 2009/0132205 A1    May 21, 2009

Related U.S. Application Data

(62) Division of application No. 11/311,204, filed on Dec. 29, 2005, now Pat. No. 7,487,067.

(51) Int. Cl.
*G06F 15/00* (2006.01)
(52) U.S. Cl. .................................... 702/189
(58) Field of Classification Search ................. 702/189
See application file for complete search history.

(56) References Cited

U.S. PATENT DOCUMENTS 5,600,527 A * 2/1997 Engel et al. ............... 361/93.2
6,144,326 A 11/2000 Krone et al.
6,442,271 B1 8/2002 Tuttle et al.
6,959,083 B2 10/2005 Scott et al.
2001/0017742 A1 8/2001 Yokozawa et al.

OTHER PUBLICATIONS http://www.askoxford.com/concise.sub.—oed/another?view=uk, p. 1, Jul. 3, 2007.
Select file history from related U.S. Appl. No: 11/311,204, dated Apr. 20, 2007 through Sep. 29, 2008, 75 pages.

* cited by examiner

*Primary Examiner*—Tung S Lau
(74) *Attorney, Agent, or Firm*—Lathrop & Gage LLP

(57) ABSTRACT

Provided is a method and system for signal-driven recovery of a digital pulse stream. The method includes receiving initial parameters including the base characteristics of a pulse signal, the characteristics including the maximum pulse interval. An incoming analog signal is converted to a digital signal and sampled a predetermined number of times at intervals greater than the maximum pulse interval to record a set of minimum signal values and a set of maximum signal values. Each set is averaged to provide an average minimum value and an average maximum value. Based on these values at least one threshold value is then determined, and the digital pulse stream is identified based on the threshold values. The method is repetitive, continually re-determining the threshold values so as to adapt to changes in the incoming signal. A system for performing the method is also provided.

11 Claims, 4 Drawing Sheets

FIG. 1 Pulse Signal on Noise

SIGNAL-DRIVEN RECOVERY OF A DIGITAL PULSE STREAM

RELATED APPLICATIONS

This application is a divisional application of U.S. patent application Ser. No. 11/311,204, filed Dec. 29, 2005 now U.S. Pat. No. 7,487,067, entitled: Signal-Driven Recovery Of A Digital Pulse Stream, the disclosure of which is incorporated herein by reference.

FIELD

This invention relates generally to the field of digital signal reception, and more specifically to signal-driven recovery of a digital pulse stream.

BACKGROUND

There has been a long-standing need for the capability of transmitting information rapidly and coherently from one location to another. Typically, the transmission of such information is performed either by way of a radio broadcast signal or by providing a signal through a conduit such as a wire.

Initially, signal transmission and reception was performed entirely with analog equipment. For example, a carrier radio signal of a specific frequency can be used to transmit voice, music and video signal information by amplitude and/or frequency modulation. By tuning to the specific frequency with a receiver, an interested party can receive the information.

Although effective, analog signals can and do suffer from a number of technical shortcomings. It is becoming increasingly more common to transform traditional analog information into digital form prior to or commensurate with transmission. Represented as a series of data bits such as logical "0" and "1" it is possible to achieve both high fidelity and perfect reproduction, depending of course on the choice of sampling rate.

Transmission of information in digital form is easily accomplished through the use of pulses. By adopting a convention, the presence of a pulse may be taken to be a logical "1", the absence of the pulse being a logical "0". Although the radio wave carrying the signal may be a traditional analog carrier wave, it is the pulse modulation in the wave that is being sent and received which corresponds to the digital information.

In an ideal setting with minimal noise, a comparator with a fixed threshold could be used to determine the presence and absence of each pulse in a detected signal. However, the real world is often far from ideal. Typically, an automatic gain control (ACG) device is used in connection with an RF receiver to collect the pulse signal. The AGC measures the signal energy in the receiver's passband, and adjusts the gain (within the constraints of an RC time constant) to normalize it to the receiver's output voltage range. In the case of an amplitude-modulated pulse signal, if the pulse signal is the dominant signal in the passband, the gain of the AGC will change with the pulse amplitude, keeping the amplitude of the detected pulses normalized to the receiver's output voltage range.

Unfortunately, the noise component in the signal comes from other sources and tends to remain constant as pulse amplitudes change. Since the noise amplitude is also altered by the AGC gain change, the effect is to change the output signal-to-noise ratio (S/N). This moves the ideal conversion threshold to various positions in the output voltage range, making a fixed conversion threshold impractical. Even worse, if no pulse signal is present, or if it fades away, noise becomes the dominant signal and the AGC will increase the gain until full-amplitude noise is produced. This condition can overload back-end processing with false pulses. Additionally, co-channel interference can appear as noise in the output, also making the S/N ratio variable. All of these phenomena can frustrate the recovery of patterns/information from the pulses in the received signal.

One partial solution to the aforementioned problems has been to provide an intermediate step designed to separate the pulse signal from the noise. This step is performed as an analog process, typically using a low pass filter/rectifier that is intended to filter out the pulses and return an integrated form of the noise, i.e. an integrated voltage level. This integrated voltage level is offset and used as a threshold by an analog comparator that compares the integrated output with the original signal to provide a digital pulse stream. Although such a process does work, there are several significant drawbacks.

For example, situations exist where the presence or absence of a signal may not be known a priori at a specific frequency. In these cases, noise-only signals may be input to the processing system. Subsequent processing of noise-only signals can and will result in false detections and can flood back-end signal processing circuitry with erroneous information.

Further, if the strength of the desired signal varies, the ability of the analog system to adjust is not very robust. The signal may be lost intermittently and not recognized for processing, or once again erroneous noise may flood the system.

Hence, there is a need for a method of signal-driven recovery of a digital pulse stream that overcomes one or more of the technical problems as stated above.

SUMMARY

This invention provides a method and system for signal-driven recovery of a digital pulse signal.

In particular, and by way of example only, according to one embodiment of the present invention, provided is a method for signal-driven recovery of a digital pulse stream. This method includes receiving initial parameters including the base characteristics of a pulse signal. These characteristics include at least the maximum pulse interval. The signal is sampled a predetermined number of times at intervals greater than the maximum pulse interval to record a set of minimum signal values and a set of maximum signal values. Each set of recorded values is averaged to provide an average minimum value and an average maximum value. At least one threshold value for the signal pulse is established based on the minimum and maximum average values. The digital stream is then identified based on the threshold values.

In yet another embodiment, provided is a system for signal-driven recovery of a digital pulse stream, including: an analog to digital converter for converting an incoming analog signal to a digital signal; an envelope detector for detecting a maximum signal value and a minimum signal value of the digital signal in a sample cycle; a digital threshold comparator for comparing the digital signal to at least one adaptively determined threshold value; a microcontroller coupled to the envelope detector to receive the detected maximum signal value and minimum signal value from the envelope detector, the microcontroller operable to control a window timer structured and arranged to initiate a new sample cycle, the microcontroller coupled to the threshold comparator and operable to provide the threshold comparator with the at least one adaptively determined threshold value for the detection of a digital pulse signal based on the threshold value, the adaptively determined threshold value determined from the maximum and minimum signal values as detected in a predetermined number of cycle windows.

DETAILED DESCRIPTION

Before proceeding with the detailed description, it is to be appreciated that the present teaching is by way of example only, not by limitation. The concepts herein are not limited to use or application with a specific method of recovery of a digital pulse stream. Thus, although the instrumentalities described herein are for the convenience of explanation, shown and described with respect to exemplary embodiments, it will be appreciated that the principles herein may be applied equally in other types of methods involving signal-driven recovery of a digital pulse stream.

Figure 1:
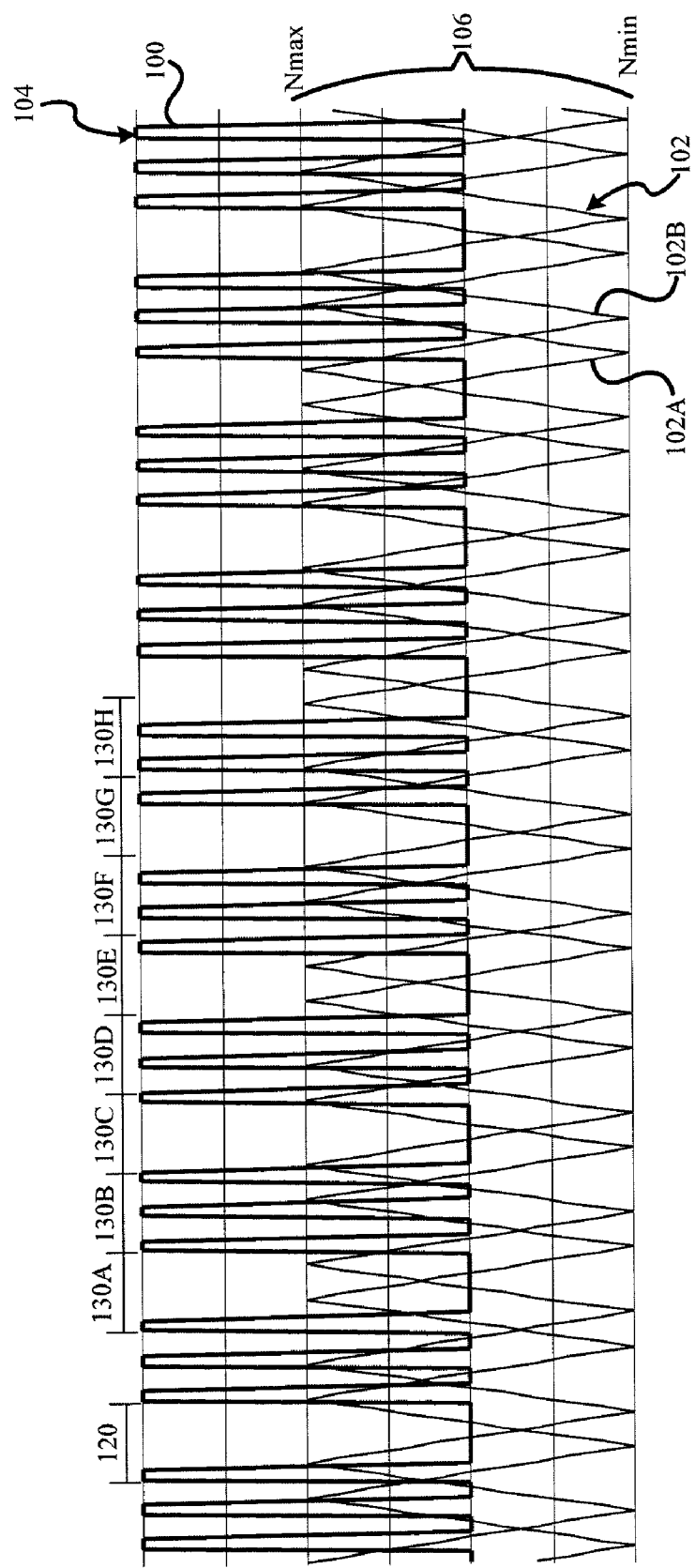
FIG. 1 is a conceptual rendering of a pulse signal on a noise signal.

FIG. 1 conceptually illustrates a digital pulse stream, also referred to as a pulse signal 100 intermixed with background noise 102. The pulse signal 100 is characterized by stream of digital pulses illustrated as pulse peaks 104. The background noise 102 may be other signals meaningful to other parties, white noise provided by source or sources unknown, or combinations thereof. For the purposes of the disclosed method, the detection of pulse signal 100 is the issue at hand; all other signals are collectively referred to simply as noise. For purposes of simplicity, background noise 102 is represented as noise signal 102A and 102B. Further, pulse signal 100 is illustrated as having a uniform and repeating pattern for ease of illustration.

As indicated, the noise 102 occupies an envelope 106 having a minimum value Nmin and a maximum value Nmax. The lower edge of the envelope of the pulse signal 100 is generally in the middle of the noise 102, with each pulse peak 104 noticeably above the Nmax value of the noise envelope. As shown, the pulse signal 100 is characterized by a series of pulses that rise above the Nmax value.

Figure 2:
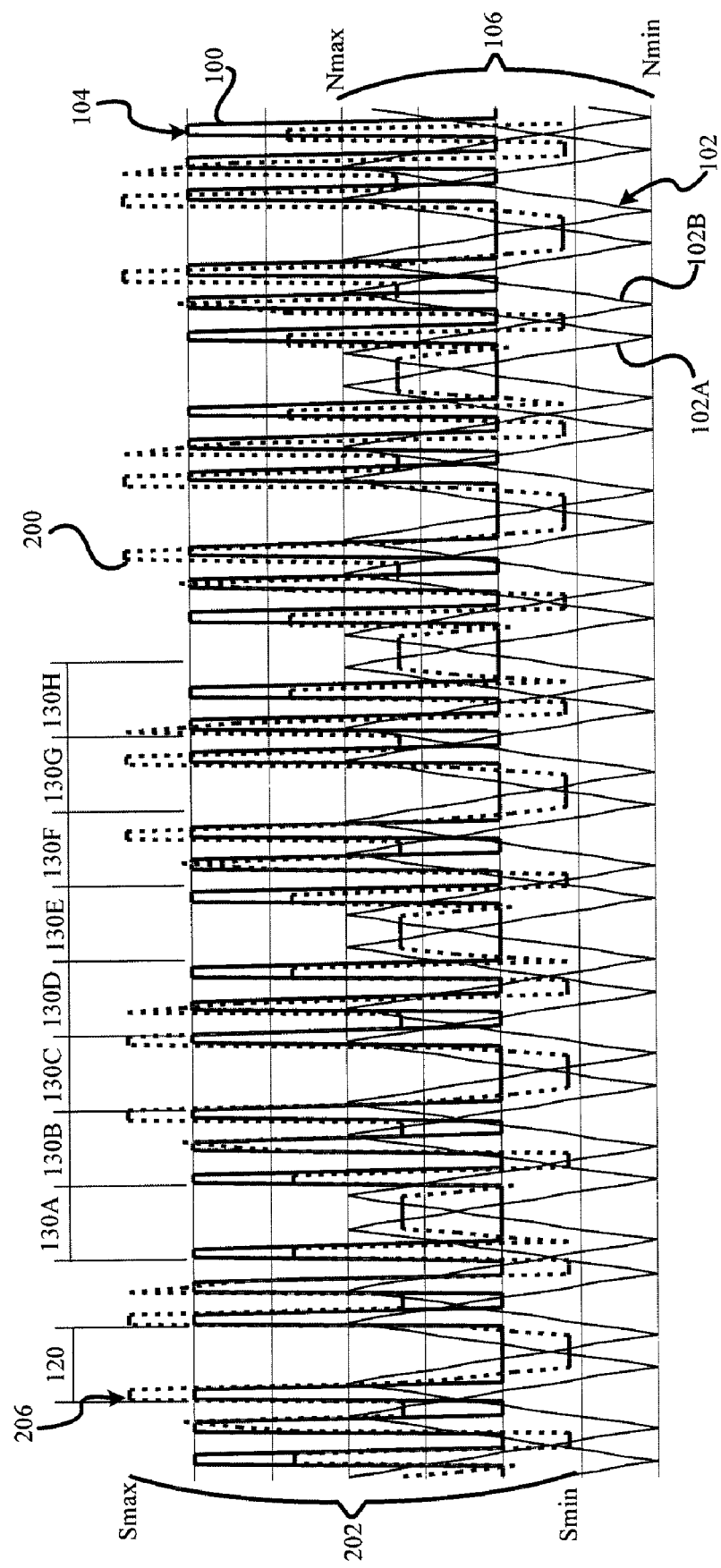
FIG. 2 is a conceptual rendering of the combined pulse and noise signals as shown in FIG. 1.

It is of course understood and appreciated that the pulse signal 100 of interest and the noise 102 combine as a single signal; however, they are illustrated as separate elements in FIG. 1 for ease of discussion and illustration. FIG. 2 is a conceptual illustration of such a combined signal 200 superimposed for comparison. The combined signal 200 has an envelope 202 having a minimum value Smin and a maximum value Smax.

Figure 3:
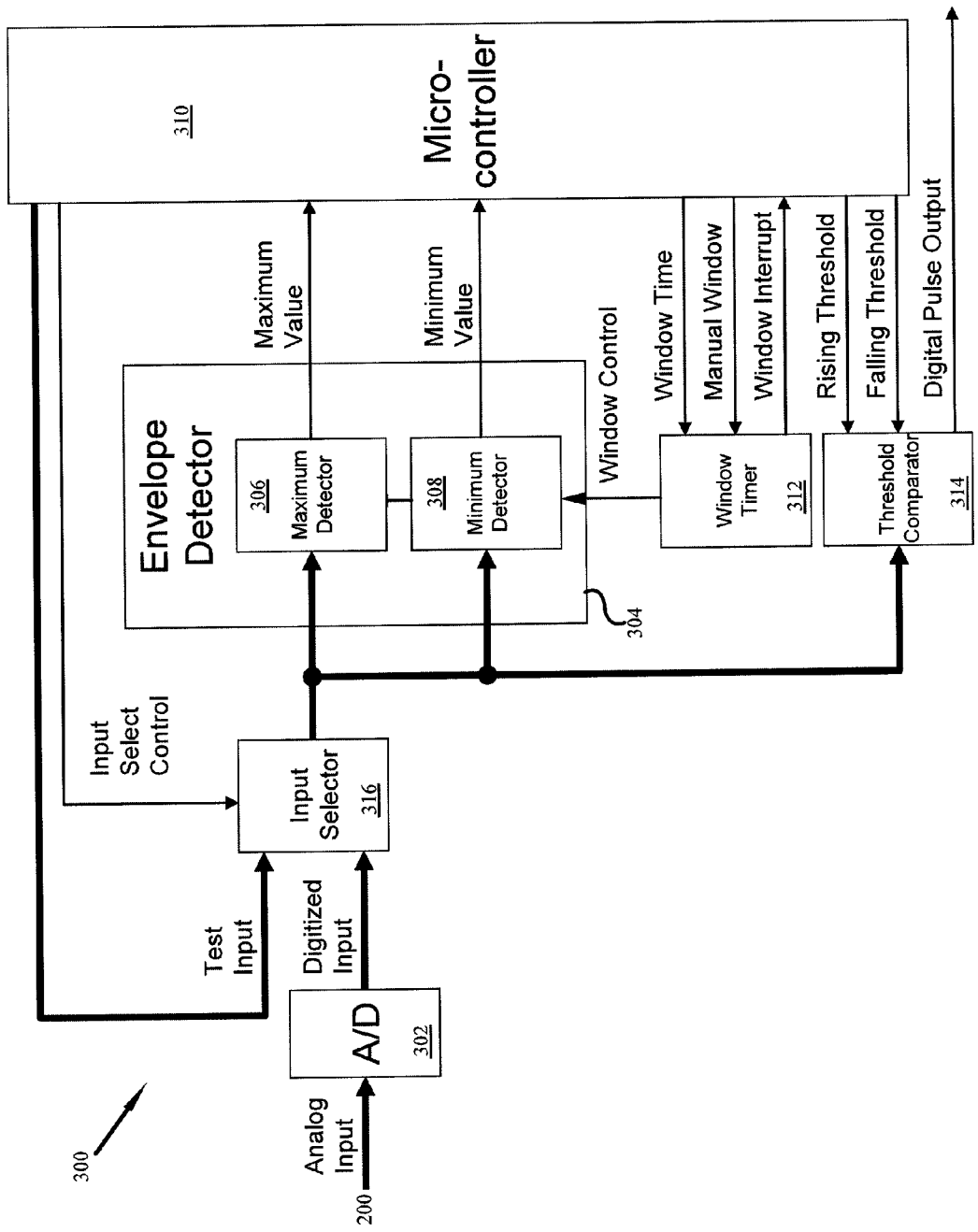
FIG. 3 is a block diagram of a system for performing signal-driven recovery of a digital pulse stream in accordance with at least one embodiment.

FIG. 3 is a block diagram of a system 300 for performing signal-driven recovery of a digital pulse stream in accordance with at least one embodiment. As shown, there is an analog to digital (A/D) converter 302, an envelope detector 304 having a maximum detector 306 and a minimum detector 308, a micro controller 310, a window timer 312, and a threshold comparator 314. In at least one embodiment, an input selector 316 is also provided.

Moreover, in at least one embodiment, the incoming signal 200 (consisting of the pulse signal 100 and noise 102, see FIG. 2) is processed by A/D converter 302. The digital output signal is then evaluated by the envelope detector 304. Having a maximum value detector 306 and a minimum value detector 308, the envelope detector 304 reports the maximum Smax and minimum Smin values to the microcontroller 310. Through a method further described below, the microcontroller 310 controls window timer 312 and provides rising threshold and falling threshold values to threshold comparator 314. The threshold comparator 314 is designed to accommodate hysteresis, usually with a value similar to the noise envelope. The hysteresis of the rising threshold and falling threshold help the threshold comparator 314 avoid oscillation, such as may be caused by noise when the pulse signal passes the vicinity of the threshold.

In at least one embodiment, the threshold comparator 314 is a Pulse Event Processor (PEP) utilizing two separate Analog-to-TTL (Transistor Transistor Logic) converter functions or ATCs. The input voltage range is between 0 and +5 VDC, and the input impedance is 91±5% ohms Each ATC utilizes an 8-bit flash A/D converter to digitize the analog inputs. Either a 4.0 or an 8.0 MHZ clock can be used to provide the two A/D converters, and in at least one embodiment, a 4.0 MHz clock is used.

With respect to the input voltage range, initially five volts correspond to a data value of two hundred fifty five (255) and zero volts correspond to a data value of zero (0). For the purposes of pulse signal detection, by general convention the presence of a pulse indicates a logical one (1) whereas the absence of a pulse indicates a logical zero (0). An alternative convention may also be adopted.

In at least one embodiment, an input selector 316 is also provided immediately in line following the A/D converter 302. Coupled to the microcontroller 310, the input selector 316 permits self diagnostics with a test signal input as provided by the microcontroller 310. Various microcontroller devices and signal envelope detector devices are known and recognized by those skilled in the art of signal processing. The precise choice of components is a matter of design preference as they are known and commonly available.

As will now be discussed with the aid of the flow diagram in FIG. 4, the method for signal-driven recovery of a digital pulse stream is an advantageously dynamic process continually updating the threshold values utilized to indicate the presence or absence of a signal pulse. In at least one embodiment, the method as described in FIG. 4 is implemented using a system 300 as described with respect to FIG. 3.

Figure 4:
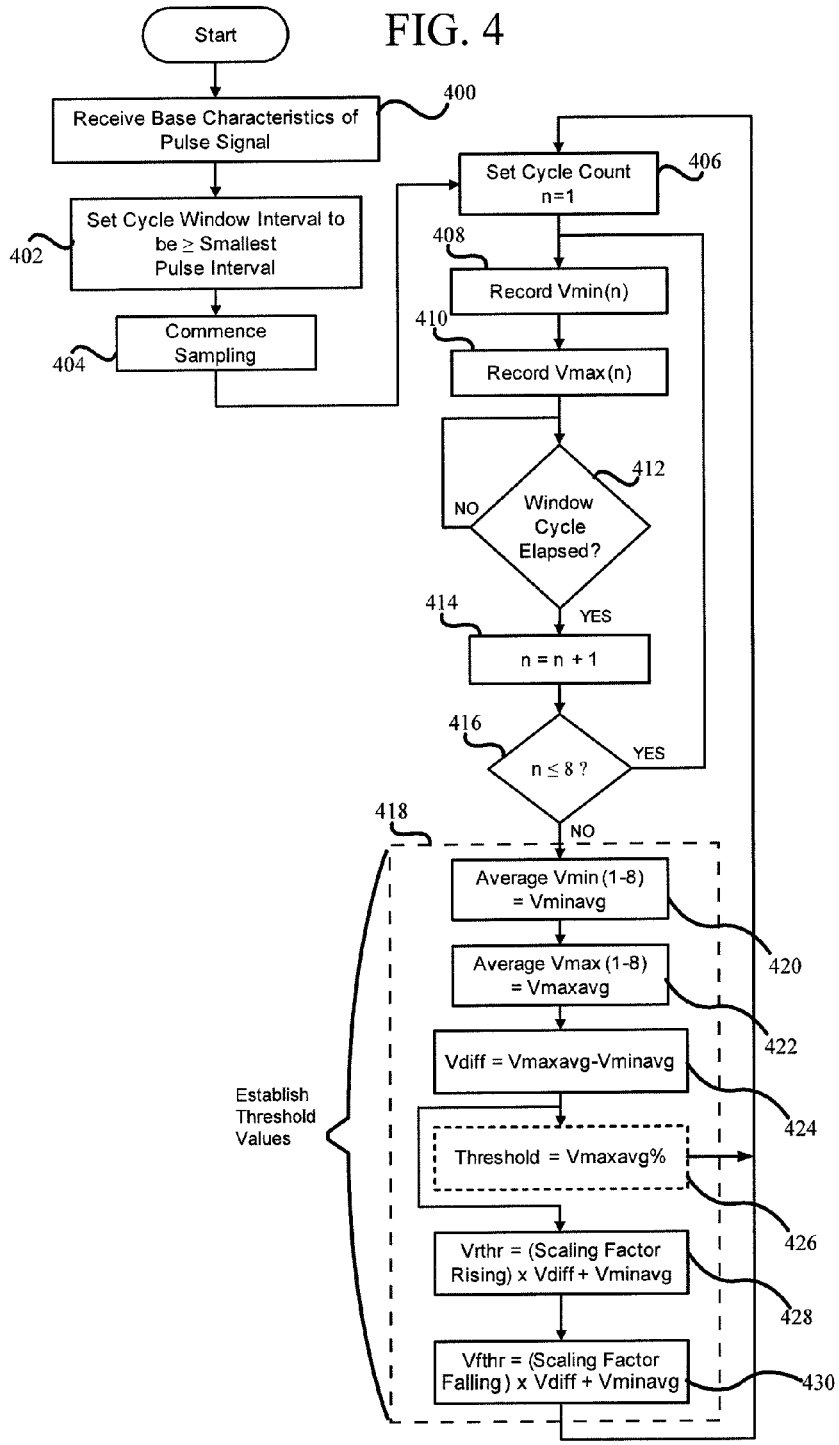
FIG. 4 is a flow diagram of a method of signal-driven recovery of the digital pulse signal shown in FIGS. 1 and 2 in accordance with at least one embodiment.

FIG. 4 presents a flow diagram that, in connection with FIGS. 1 and 2 presents a method for signal-driven recovery of a digital pulse stream in accordance with at least one embodiment. It will be appreciated that the described method need not be performed in the order herein described, but that this description is merely exemplary of at least one preferred method of signal-driven recovery of a digital pulse stream.

As shown in FIG. 4, the method typically commences with the system receiving initial parameters including the base characteristics of the pulse signal, shown in block 400. These initial parameters include the maximum pulse interval such as, for example, ten milliseconds. As is further described below, the initial parameters may also include user supplied data corresponding to: a rising scaling factor (SFr); a falling scaling factor (SFf); a Clamp value, a Clip value and a predetermined number to establish a set of sampled signal values. In at least one embodiment, the Clamp and Clip values are voltage values. As is further described below, the Clamp value is a voltage value that serves as a temporary substitute value when the incoming signal in digital form has a low value. Similarly, the Clip value is a voltage value that serves as a temporary substitute value when the incoming signal in digital form has a high value.

Referring back to FIG. 1, a cycle window interval is established to insure the capture of at least one pulse, as shown in block 402. Moreover, the cycle window is established to be at least the maximum pulse interval, thereby insuring that at least one pulse will be detected during each cycle window. In at least one embodiment, the predetermined number of cycles to establish a set of sampled signal values is eight.

With respect to FIGS. 1 and 2, the maximum pulse interval is shown as spacing 120. A cycle window is represented as interval 130, intervals 130A~130H providing the eight cycles to establish a preferred set. It is understood and appreciated that the cycle intervals could be substantially greater than the maximum pulse interval, such as a multiple of a factor of two or greater. An advantage of the signal-driven recovery method is that it is adaptive to changes in both the noise 102 and pulse signal 100. When the cycle window 130 is set with excessively large periods, the adaptive nature of the method may be hampered. As such, in at least on embodiment the cycle window is established to be no shorter than one maximum pulse interval 120, and not equal to or greater than two maximum pulse intervals 120.

As indicated in block 404 of FIG. 4, sampling of the signal now commences. Initially, the cycle count is set to n=1, as shown in block 406. For each instance of a cycle n, the minimum and maximum voltages of the signal 200 are recorded as Vmin and Vmax respectively, shown in blocks 408, 410 as driven by the evaluation of the cycle window, shown as decision 412. The ATCs as introduced above are used to measure the Vmin and Vmax of the input signal 200 during each cycle.

Upon elapse of the cycle window, the cycle count n is incremented by one, shown in block 414. The cycle count is then evaluated, shown in decision 416, to see if the predetermined number of set values have been collected, i.e., eight as in the case of the illustrated example. With respect to FIG. 1, it is appreciated that intervals 130A, 130B, 130D, 130E, 130F and 130G each span the occurrence of a single pulse peak, and therefore recorded Vmax set values representative of the pulse peaks 104.

A record of the set of Vmin values and the set of Vmax values is maintained in a queue or database for each threshold update cycle. Upon commencing a new threshold update, the previously recorded set values are replaced by the new values.

With a set of Vmax and Vmin values now established, the threshold values for the signal detection are now established, indicated by the actions within the dotted box 418. An average of the minimum recorded values, Vminavg, is determined as shown in block 420. Similarly, an average of the maximum recorded values, Vmaxavg, is determined as shown in block 422. With the average maximum and average minimum values the difference therebetween, Vdiff, is determined, shown in block 424. Vdiff corresponds to the peak to peak amplitude of the signal (digital pulse 100 and noise 102) for the cycle set.

With respect to FIG. 2 and the rendering of the combined signal 200, there is significant variation in the actual signal peaks 206 corresponding to the digital pulse peaks. However, as illustrated in the model shown, each signal peak 206 is above the Nmax value of the noise.

In at least one embodiment, a predetermined percentage of Vmaxavg is used to establish the threshold for recognition of a pulse 104, shown in optional dotted block 426. In at least one embodiment, the threshold is established to be equal to or greater than seventy five percent (75%) of Vmaxavg.

It is understood and appreciated that in most situations there will be some minor fluctuation, otherwise known as chatter, as the incoming signal 200 varies above and below the threshold setting as established in block 426. To alleviate this, a rising threshold value (Vrthr) and a falling threshold value (Vfthr) are determined in preferred blocks 428, 429. Specifically, Vrthr and Vfthr provide hysteresis to further aid in the proper detection of the signal pulse. In at least one embodiment, Vrthr is determined by multiplying a user supplied scaling factor by Vdiff and adding Vminavg, shown in block 428. Likewise, Vfthr is determined by multiplying a user supplied scaling factor by Vdiff and adding Vminavg as shown in block 430.

Without hysteresis, a small amount of noise or interference when combined with the input signal can cause undesirable rapid changes between the two output states of the comparator. By using a threshold comparator 314 with hysteresis (Vrthr and Vfthr) the oscillation, i.e. chatter, is prevented. In at least one embodiment, the hysteresis values of Vrthr and Vfthr are applied as positive feedback to the comparator, one trip point for the rising input voltage (Vrthr) and one for the falling input voltage (Vfthr). When the comparator's input voltages are equal, the hysteresis values cause one input to move quickly past the other, thereby removing the input voltages from the region where oscillation occurs.

In at least one embodiment, the rising threshold, Vrthr, is used when the ATC output is low. Similarly, the falling threshold, Vfthr, is used when the ATC output is high. As such, the Vrthr and Vfthr values provide a user-adjustable amount of voltage hysteresis in the ATCs so as to avoid chatter and more precisely detect the true presence of a digital pulse in the incoming signal 200.

As this process is repetitive, it is of course realized that the values can and likely will change over time due to variances in the incoming signal 200. This adaptive ability to change threshold values in response to changes in the incoming combined signal 200 is an advantageous feature of at least one embodiment of the method and system for signal-driven recovery of a digital signal.

In at least one embodiment, two additional values are utilized to insure that errant values are not inadvertently provided to the system, specifically a Clamp voltage and a Clip voltage. When Vdiff approaches a low value indicating a small envelope 202 for the signal 200, a purposefully selected artificial low value, i.e. the Clamp voltage, is substituted for the scaling factor and Vdiff in the determination of Vrthr and Vfthr. When the envelope 202 of the signal 200 rises to a sufficient size, the Clamp voltage is no longer substituted. The point at which the Clamp voltage is to be substituted is a user defined value.

In a similar manner, it is possible for the signal envelope 202 to reach the maximum input value. In such an instance, the Clip value is substituted to establish an artificial threshold maximum that is below the actual envelope maximum. As the method is iterative, it is not likely that the substitution of either the Clamp or Clip values will be ongoing, rather, the Clamp and Clip voltage values provide temporary measures that permit the system to continue to self adjust and avoid run away of the system in errant identification.

This method of determining threshold values for the signal-driven recovery of the digital pulse stream is an ongoing and repetitive process. More specifically, these values are determined independently from the actual process of detecting the digital signal illustrated in the flow diagram of FIG. 5.

Figure 5:
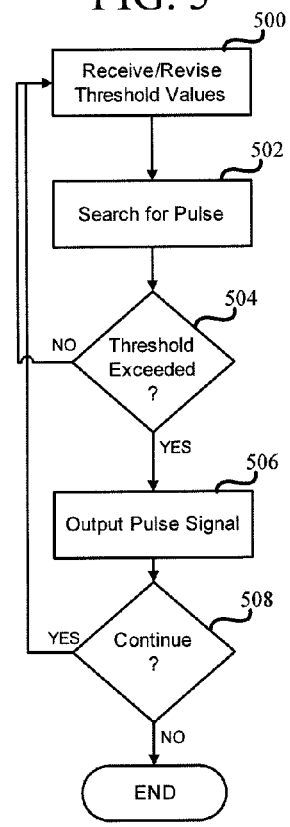
FIG. 5 is a flow diagram of the method of signal detection based on the threshold values provided by the method in FIG. 4.

The search for the signal initially commences with the receipt of the determined threshold values from the process as shown and described with respect to FIG. 4, shown in block 500, FIG. 5. The incoming signal 200 is then searched for instances which exceed the threshold values, shown in block 502 and decision 504. In response to the signal exceeding the threshold, an output pulse signal is provided, shown in block 506, or else the process cycles back to block 500 receive and revise the threshold settings, if new values have been determined. Following the output of the pulse signal in block 506, decision 508 permits the search to end, or to cycle back to block 500. In such manner, this method of signal-driven recovery of a digital pulse stream is advantageously adaptive to changes in the incoming signal 200.

In addition to the conceptually represented system depicted in FIG. 3 above, in at least one embodiment, the method for signal-driven recovery of a digital pulse stream is implemented with a computer system. The computer system may be a commercially available system, such as a desktop workstation unit provided by IBM, Dell Computers, Gateway, Apple, Sun Microsystems or other computer system provider and is equipped with a signal processing capability, such as by a commercially available sound card. Those skilled in the art will understand and appreciate the physical composition of components and component interconnections comprising computer system, and select a computer system suitable for the performing the method of signal driven recovery of the digital pulse stream.

When the computer system is activated, preferably an operating system will load into main memory as part of the boot strap startup sequence and ready the computer system for operation. At the simplest level, and in the most general sense, the tasks of an operating system fall into specific categories—process management, device management (including application and user interface management) and memory management.

In such a computer system, the central processing unit (CPU) is operable to perform one or more of methods of signal-driven recovery of the digital pulse stream as described above. Those skilled in the art will understand that a computer-readable medium having a computer program for signal-driven recovery of the digital pulse stream may be provided to the computer system. The form of the medium and language of the program are understood to be appropriate for the computer system. Utilizing the memory stores, such as for example one or more hard drives and main system memory, the operable CPU will read the instructions provided by the computer program and operate to perform the signal-driven recovery of the digital pulse stream as described above.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A system for signal-driven recovery of a digital pulse stream, comprising:
   an analog to digital converter for converting an incoming analog signal representing the digital pulse stream to a digital signal;
   an envelope detector for detecting a maximum signal value and a minimum signal value of the digital signal in a sample cycle selected to sample at least one pulse component of the digital signal;
   a digital threshold comparator for comparing the digital signal to at least one adaptively determined threshold value; and
   a microcontroller coupled to the envelope detector to receive the detected maximum signal value and minimum signal value from the envelope detector, the microcontroller operable to control a window timer structured and arranged to initiate a new sample cycle, the microcontroller coupled to the threshold comparator and operable to provide the threshold comparator with the at least one adaptively determined threshold value for the detection of a digital pulse signal based on the threshold value, the adaptively determined threshold value determined from the maximum and minimum signal values as detected in a predetermined number of cycle windows.

2. The system of claim 1, wherein the system further includes an input selector coupled between the analog to digital converter and the envelope detector, the input selector operable to provide the digital signal or a test signal to the envelope detector.

3. The system of claim 1, wherein the digital threshold comparator is a pulse event processor utilizing two separate analog-to-TTL converters.

4. The system of claim 1, wherein the system is operable to:
   receive initial parameters including the base characteristics of a pulse stream, the characteristics including the maximum pulse interval;
   set a cycle window interval to at least the maximum pulse interval;
   initiate a sample cycle and sampling a signal to record a minimum signal value and a maximum signal value;
   in response to the cycle window interval elapsing, repeating the initiation of a sample cycle to collect a predetermined number of minimum and maximum signal values;
   average the predetermined number of minimum signal values to provide an average minimum signal value (Vminavg);
   average the predetermined number of maximum signal values to provide an average maximum signal value (Vmaxavg);
   establish at least one threshold value for a signal pulse based on the minimum and maximum average values; and
   identify the digital pulse stream within the signal based on the threshold values.

5. The system of claim 4, wherein the predetermined number is eight.

6. The system of claim 4, wherein the threshold values are continuously re-established while the digital pulse stream is being detected.

7. A method of signal-driven recovery of a digital pulse stream comprising the steps of:
   converting the analog waveform representing the digital pulse stream to a digital signal;
   providing the digital signal to an envelope detector for detecting a maximum signal value and a minimum signal value of the digital signal in a sample cycle selected to sample at least one pulse component of the digital signal;
   determining an adaptive threshold value from the maximum signal value and the minimum signal value detected in at least one sample cycle;
   comparing the digital signal to the adaptive threshold value; and outputing a pulse signal if the digital signal exceeds the adaptive threshold value.

8. The method of claim 7 further comprising the step of selecting between the digital signal or a test signal for providing to the envelope detector.

9. The method of claim 7 further comprising the steps of:

receiving initial parameters including the base characteristics of a digital pulse stream including the maximum pulse interval;

setting the sample cycle to at least the maximum pulse interval.

10. The method of claim 9 wherein the step of determining an adaptive threshold value further comprises:

measuring the maximum signal value and minimum signal value of the digital signal for a plurality of sample cycles to collect a predetermined number of minimum and maximum signal values;

averaging the predetermined number of minimum signal values to provide an average minimum signal value;

averaging the predetermined number of maximum signal values to provide an average maximum signal value;

establishing at least one threshold value for a signal pulse based on the minimum and maximum average values.

11. The method of claim 7 further comprising continuously determining the adaptive threshold value while the digital pulse signal is recovered.

* * * * *